(12) United States Patent
Lee (10) Patent No.: US 12,442,774 B2
(45) Date of Patent: Oct. 14, 2025

(54) SUBSTRATE INSPECTING APPARATUS AND OPERATING METHOD THEREOF

(71) Applicant: SEMES CO., LTD., Cheonan-si (KR)

(72) Inventor: Yong Jun Lee, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 56 days.

(21) Appl. No.: 18/534,505

(22) Filed: Dec. 8, 2023

(65) Prior Publication Data

US 2024/0192144 A1 Jun. 13, 2024

(30) Foreign Application Priority Data

Dec. 9, 2022 (KR) .................. 10-2022-0171775

(51) Int. Cl.
*G01N 21/95* (2006.01)
*G01N 21/956* (2006.01)
*G02B 5/30* (2006.01)
*H01L 21/66* (2006.01)

(52) U.S. Cl.
CPC ....... *G01N 21/9501* (2013.01); *G01N 21/956* (2013.01); *G02B 5/3058* (2013.01); *H01L 22/12* (2013.01)

(58) Field of Classification Search
CPC .. G01N 21/9501; G01N 21/956; G01N 21/01; G01N 21/21; G01N 21/55; G01N 21/8806; G01N 2021/8845; G01N 2021/8848; G01N 2201/127; G02B 5/3058; H01L 22/12; H01L 22/20; G01B 11/06

See application file for complete search history.

(56) References Cited

U.S. PATENT DOCUMENTS

| 10,101,676 | B2 | 10/2018 | Fu et al. |
| 10,288,412 | B2 | 5/2019 | Inoue et al. |
| 2007/0024998 | A1* | 2/2007 | Bills ............... G06T 7/0004 359/850 |
| 2008/0246966 | A1* | 10/2008 | Oomori ............... G01N 21/956 356/445 |

FOREIGN PATENT DOCUMENTS

| JP | 6371926 | 7/2018 |
| KR | 10-2018-0133218 | 12/2018 |
| KR | 10-2373283 | 3/2022 |

* cited by examiner

Primary Examiner — Seung C Sohn (57) ABSTRACT

Proposed is a substrate inspecting apparatus and an operating method of the substrate inspecting apparatus capable of detecting and correcting angle of incidence (AOI) distortion occurring during an optical-based substrate inspection process. The substrate inspecting apparatus includes a light source generating incident light, an illumination optical system forming an optical path of the incident light, an imaging optical system forming an optical path of reflected light reflected from a substrate, a light detector that receives the reflected light and converts the received reflected light into an electrical signal, and a processor that generates a spectral image from the electrical signal.

20 Claims, 8 Drawing Sheets

SUBSTRATE INSPECTING APPARATUS AND OPERATING METHOD THEREOF

CROSS REFERENCE TO RELATED APPLICATION

The present application claims priority to Korean Patent Application No. 10-2022-0171775, filed Dec. 9, 2022, the entire contents of which is incorporated herein for all purposes by this reference.

BACKGROUND OF THE INVENTION

Field of the Invention

The present disclosure relates to an optical-based substrate inspecting apparatus and an operating method thereof.

Description of the Related Art

The semiconductor manufacturing process is a process of manufacturing semiconductor devices on a substrate (e.g., wafer) and includes, for example, exposure, deposition, etching, ion implantation, cleaning, etc. In order to perform each manufacturing process, semiconductor manufacturing equipment for performing individual processes is provided in cleanrooms of a semiconductor manufacturing plant so that a processing process is performed on a substrate put into the semiconductor manufacturing equipment. Meanwhile, a semiconductor manufacturing plant may be equipped with a substrate inspecting apparatus to investigate the surface characteristics of a substrate in the intermediate steps in the semiconductor manufacturing process.

As a substrate inspection method using optics, ellipsometry or reflectometry, for example, may be used. Ellipsometry is an optical technique for investigating dielectric properties of substrates. Ellipsometry extracts information by measuring a change in polarization of light reflected from a sample (e.g., wafer surface) to. For example, when light is reflected from the sample, the polarization state of the reflected light changes depending on the optical properties of the sample material and the thickness of the sample layer. Ellipsometry measures the change in polarization to obtain the complex refractive index or dielectric function tensor, which is the basic physical quantity of a material, and derives information about the sample, such as the form of the material, crystallinity, chemical structure, and electrical conductivity. Meanwhile, imaging ellipsometry (IE) or spectroscopic imaging ellipsometry (SIE) is a type of ellipsometry that employs broadband light sources. Imaging reflectometry is a method of inspecting a substrate by measuring the reflectance of light reflected from the substrate.

In the case of optical-based substrate inspecting apparatuses, inspection of a substrate is performed by irradiating the substrate with surface light having a certain cross-sectional area. When it comes to surface light, a phenomenon may occur where angle of incidence (AOI) varies depending on the location of irradiation on the substrate. That is, local angle of incidence distortion may occur. Distortion of the angle of incidence may occur due to distortion of a light source emitting the incident light or an optical system where the reflected light enters. In addition, distortion of the angle of incidence may occur due to distortion of a stage on which the substrate is placed. Incident angle distortion may also occur due to non-collimated beam from the light source.

SUMMARY OF THE INVENTION

Accordingly, the present disclosure has been made keeping in mind the above problems occurring in the related art, and the present disclosure is intended to provide a substrate inspecting apparatus and an operating method of the substrate inspecting apparatus capable of detecting and correcting angle of incidence (AOI) distortion occurring during an optical-based substrate inspection process.

In order to achieve the above objective, according to an embodiment of the present disclosure, there is provided an optical-based substrate inspecting apparatus, including: a light source configured to generate incident light; an illumination optical system configured to form an optical path of the incident light; an imaging optical system configured to form an optical path of reflected light reflected from a substrate; a light detector configured to receive the reflected light and convert the received reflected light into an electrical signal; and a processor configured to generate a spectral image from the electrical signal, wherein the processor may obtain standard reflectance distribution data according to changes in inspection parameters for a first substrate, identify configuration values for the inspection parameters, obtain measured reflectance distribution data for a second substrate using the inspection parameters to which the configuration values are applied, calculate an angle of incidence (AOI) distribution within a field of view (FOV) by comparing the standard reflectance distribution data and the measured reflectance distribution data, and detect a distortion area where AOI distortion occurs in the FOV based on the AOI distribution.

According to the present disclosure, the illumination optical system may include: a frequency filter configured to pass a frequency component corresponding to a passing frequency in the incident light; and a polarization filter configured to pass a specific polarization component in the incident light.

According to the present disclosure, the imaging optical system may include: an analyzer configured to pass a specific polarization component in the reflected light.

According to the present disclosure, the frequency filter may correspond to a bandpass filter.

According to the present disclosure, the frequency filter may correspond to a Bragg notch filter consisting of a plurality of polarized mirrors.

According to the present disclosure, the inspection parameters may include a passing frequency of the incident light, a polarization component of the incident light, and a polarization component of the reflected light.

According to the present disclosure, the processor may repeatedly obtain reflectance distribution data for the first substrate while changing standard configuration values of the inspection parameters, and generate standard reflectance distribution data by accumulating the reflectance distribution data according to reference configuration values of the inspection parameters.

According to the present disclosure, the processor may determine user input values or sensor detection values for the inspection parameters as configuration values.

According to the present disclosure, the processor may obtain reference reflectance distribution data for a third substrate using the inspection parameters to which the configuration values applied, compare the reference reflectance distribution data and the measured reflectance distribution data to extract a reference AOI value from the distortion area, correct the AOI distortion in the distortion area using the reference AOI value, and output a spectral image with the AOI distortion corrected.

According to the present disclosure, the processor may output an alarm about an occurrence of AOI distortion.

According to the present disclosure, the processor may output the alarm when the AOI distortion occurs more than a standard number of times.

According to the present disclosure, the processor may output the alarm when a degree of the AOI distortion is greater than an allowable range.

An operating method of an optical-based substrate inspecting apparatus according to the present disclosure includes: obtaining standard reflectance distribution data according to changes in inspection parameters for a first substrate; identifying configuration values for the inspection parameters; obtaining measured reflectance distribution data for a second substrate using the inspection parameters to which the configuration values are applied; calculating an angle of incidence (AOI) distribution within a field of view (FOV) by comparing the standard reflectance distribution data and the measured reflectance distribution data; and detecting a distortion area where AOI distortion occurs in the FOV based on the AOI distribution.

According to the present disclosure, the obtaining standard reflectance distribution data may include: repeatedly obtaining reflectance distribution data for the first substrate while changing standard configuration values of the inspection parameters; and generating standard reflectance distribution data by accumulating the reflectance distribution data according to reference configuration values of the inspection parameters.

According to the present disclosure, the identifying configuration values for the inspection parameters may include: determining user input values or sensor detection values for the inspection parameters as configuration values.

According to the present disclosure, the operating method of an optical-based substrate inspecting apparatus may further include: obtaining reference reflectance distribution data for a third substrate using the inspection parameters to which the configuration values applied; comparing the reference reflectance distribution data and the measured reflectance distribution data to extract a reference AOI value from the distortion area; correcting the AOI distortion in the distortion area using the reference AOI value; and outputting a spectral image with the AOI distortion corrected.

According to the present disclosure, the operating method of an optical-based substrate inspecting apparatus may further include: outputting an alarm about an occurrence of the AOI distortion.

According to the present disclosure, the outputting an alarm about an occurrence of the AOI distortion may include: outputting the alarm when the AOI distortion occurs more than a standard number of times or a degree of the AOI distortion is greater than an allowable range.

An operating method of an optical-based substrate inspecting apparatus according to the present disclosure includes: obtaining standard reflectance distribution data according to changes in inspection parameters for a first substrate; identifying configuration values for the inspection parameters; obtaining measured reflectance distribution data for a second substrate using the inspection parameters to which the configuration values are applied; calculating an angle of incidence (AOI) distribution within a field of view (FOV) by comparing the standard reflectance distribution data and the measured reflectance distribution data; detecting a distortion area where AOI distortion occurs in the FOV based on the AOI distribution; outputting an alarm about an occurrence of the AOI distortion; obtaining reference reflectance distribution data for a third substrate using the inspection parameters to which the configuration values applied; comparing the reference reflectance distribution data and the measured reflectance distribution data to extract a reference AOI value from the distortion area; correcting the AOI distortion in the distortion area using the reference AOI value; outputting a spectral image with the AOI distortion corrected; and investigating surface characteristics of the second substrate from the spectral image.

According to the present disclosure, in the optical-based substrate inspection process, more precise substrate inspection can be performed by detecting a distortion area where angle of incidence (AOI) distortion occurs within the field of view (FOV).

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, with reference to the accompanying drawings, embodiments of the present disclosure will be described in detail so that those skilled in the art may easily carry out the present disclosure. The present disclosure may be embodied in many different forms and is not limited to the embodiments set forth herein.

In order to clearly describe the present disclosure, parts irrelevant to the description are omitted, and the same reference numerals are assigned to the same or similar components throughout the specification.

In addition, in various embodiments, components having the same configuration will be described only in representative embodiments by using the same reference numerals, and in other embodiments, only configurations different from the representative embodiments will be described.

Throughout the specification, when a part is said to be "connected (or coupled)" to another part, this includes not only the case of being "directly connected (or coupled)" but also "indirectly connected (or coupled)" with another member in between. In addition, when a part "includes", "has", or "comprises" a certain part, this means that other components may be further included without excluding other components unless otherwise stated.

Unless otherwise defined, all terms used herein, including technical or scientific terms, have the same meaning as commonly understood by a person skilled in the art. Terms such as those defined in the commonly used dictionaries should be construed as having meanings consistent with the meanings in the context of the related art and shall not be construed in ideal or excessively formal meanings unless expressly defined in this application.

An optical-based substrate inspecting apparatus 1 is equipment that performs inspection of a substrate W based on imaging ellipsometry (IE). Optical-based substrate inspection methods include imaging ellipsometry, which measures polarization components, or imaging reflectometry, which measures reflectance, and various optical-based image measurement methods may also be used. IE may include spectroscopic imaging ellipsometry (SIE). Ellipsometry is a method of measuring the optical microstructure of a single-layer thin film or multi-layer thin film on a sample by analyzing the polarization state that changes when incident light is reflected from the sample. Since ellipsometry uses reflection of light, it does not require specific measurement conditions such as vacuum. Meanwhile, spectroscopic ellipsometry with added spectral function improves the reliability of analysis by measuring and analyzing the inspection target based on information measured at multiple wavelengths. Based on this ellipsometry or spectroscopic ellipsometry, a two-dimensional spectral image may be generated through a light detector 40 such as a charge-coupled device (CCD) camera. Inspection methods of analyzing spectral images are referred to as imaging ellipsometry or spectroscopic imaging ellipsometry.

Figure 1:
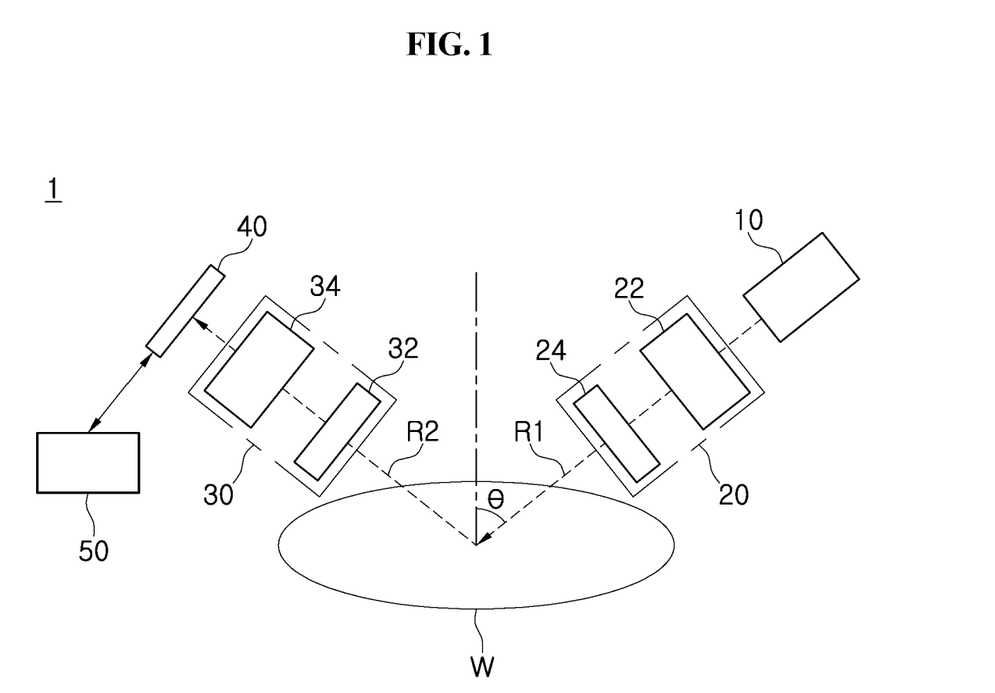
FIG. 1 is a view showing the structure of an optical-based substrate inspecting apparatus according to the present disclosure.

Hereinafter, the optical-based substrate inspecting apparatus 1, an operating method thereof, and substrate inspection method according to the present disclosure will be described. FIG. 1 is a view showing the structure of the optical-based substrate inspecting apparatus 1 according to the present disclosure. The optical-based substrate inspecting apparatus 1 according to the present disclosure includes: a light source 10 generating incident light R1; an illumination optical system 20 forming an optical path of the incident light R1; an imaging optical system 30 forming an optical path of reflected light R2 reflected from a substrate W; a light detector 40 that receives the reflected light R2 and converts the received reflected light R2 into an electrical signal; and a processor 50 that generates a spectral image from the electrical signal.

In the optical-based substrate inspecting apparatus 1 using optics, uniformity within one field of view (FOV) of a camera is important. However, if uniformity deteriorates within one FOV due to various problems caused by a light source, errors may occur in image analysis.

Figure 2:
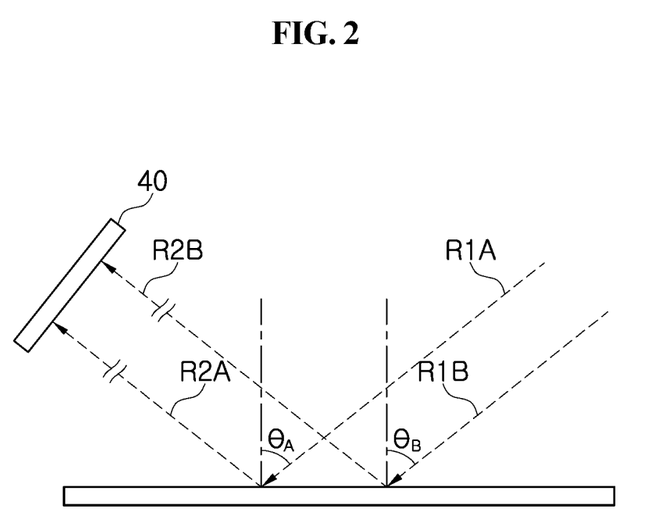
FIG. 2 is a view showing an angle of incidence (AOI) distortion occurring in a substrate inspecting apparatus.

The present disclosure verifies local angle of incidence (AOI) distortion, which may account for the largest proportion of factors that reduce uniformity within the FOV, and infers and compensates for the AOI for each pixel where AOI distortion occurs. For example, as shown in FIG. 2, compared to a first incident angle θ1 of a first incident light R1A incident on the substrate W, a second incident light R1B may be distorted for some reason and enter at a second incident angle θ1. A first reflected light R2A in which the first incident light R1A is reflected from the substrate W and a second reflected light R2B in which the second incident light R1B is reflected in the substrate W are detected by the light detector 40. When angle of incidence distortion (AOI distortion) occurs as shown in FIG. 2, distortion may occur in the signal in a specific area in the pixel array of the light detector 40. Accordingly, the optical-based substrate inspecting apparatus 1 capable of measuring and compensating for such AOI distortion is provided.

Thus, measurement value uniformity within the FOV may be achieved, and the surface condition of the substrate (e.g., film thickness) may be accurately measured while eliminating problems caused by equipment errors and errors in the inspection process. In addition, measurement change points may be minimized through continuous monitoring of AOI distortion.

The light source 10 generates light and emits the generated light toward the substrate W. The light source 10 may emit light at an angle inclined by a certain angle with respect to the substrate W. The light source 10 may generate light of multiple wavelengths and emit the generated light.

The illumination optical system 20 guides the converted incident light R1 to the substrate W through a conversion process for the incident light R1 emitted from the light source 10. The illumination optical system 20 may include: a frequency filter 22 that passes a frequency component corresponding to the passing frequency in the incident light R1; and a polarization filter 24 that passes a specific polarization component in the incident light R1. Although not shown, the illumination optical system 20 may include a monochromator that converts broadband light into monochromatic light, and a collimator that converts monochromatic light into parallel light and outputs the parallel light.

Figure 3A:
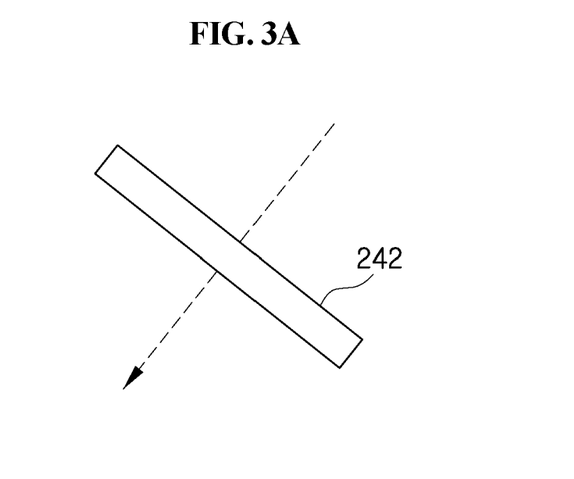
FIGS. 3A and 3B show examples of a frequency filter according to the present disclosure.
Figure 3B:
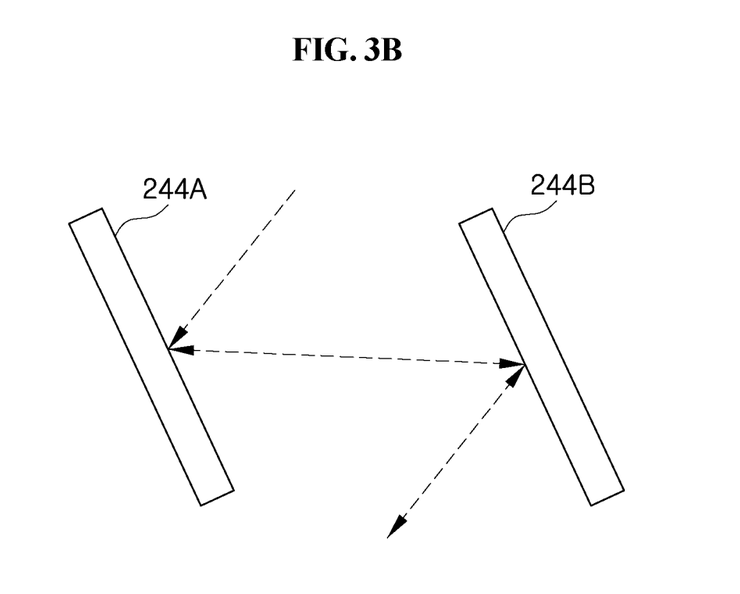

According to the present disclosure, the illumination optical system includes the frequency filter 22 so that only specific frequency components in the incident light R1 pass through. That is, the frequency filter 22 allows narrow-band incident light R1 to enter the substrate W. According to an embodiment, as shown in FIG. 3A, the illumination optical system 20 may correspond to a bandpass filter 242 that passes only narrow-band light components. According to an embodiment, as shown in FIG. 3B, the illumination optical system 20 may correspond to a Bragg notch filter consisting of a plurality of polarized mirrors 244A and 244B.

The imaging optical system 30 guides the reflected light R2 to the light detector 40 through a conversion process for the reflected light R2 reflected from the substrate W. The imaging optical system 30 may include: an analyzer 32 that passes a specific polarization component in reflected light R2; and an optical instrument 34 containing one or more mirrors, beam splitters, or lenses.

The light detector 40 may convert the reflected light R2 reflected from the substrate W into an electrical signal. The light detector 40 may be composed of an array of pixels that generate an electrical signal in response to emitted light. The light detector may correspond to a charge-coupled device (CCD) camera.

The processor 50 may generate a two-dimensional spectral image from the electrical signal provided from the light detector 40. According to the present disclosure, the processor 50 may generate a spectral image by detecting local AOI distortion and correcting the AOI distortion. In addition, the processor 50 may measure surface characteristics (e.g., film thickness) of the substrate W from the spectral image.

According to the present disclosure, the processor 50 may calculate the AOI distribution within the FOV and detect the distortion area where AOI distortion occurs in the FOV based on the AOI distribution by obtaining standard reflectance distribution data according to changes in a plurality of inspection parameters for a first substrate, identifying configuration values for the inspection parameters, obtaining measured reflectance distribution data for a second substrate by using the inspection parameters to which the configuration values are applied, and comparing the measured reflectance distribution data with the standard reflectance distribution data.

The inspection parameters include the passing frequency of incident light R1, the polarization component of incident light R1, the polarization component of reflected light R2, and the angle of incidence (AOI) of incident light R1.

A configuration of standard reflectance distribution data is established when the optical-based substrate inspecting apparatus 1 is initially installed. Standard reflectance distribution data is constructed by changing the value of the inspection parameter and measuring the reflected light R2 detected for each pixel of the light detector 40 for the value of each parameter. That is, the standard reflectance distribution data consists of the reflectance for each pixel of the light detector 40 defined for each inspection parameter. Reflectance is defined as the amount of reflected light R2 compared to incident light R1. The first substrate used to generate standard reflectance distribution data may be a reference substrate made of a material whose reflectance is more sensitive to AOI than a typical wafer. That is, the first substrate may be a patterned wafer or non-patterned wafer of which reflectance is more sensitive to AOI than a typical wafer.

The processor 50 may repeatedly obtain reflectance distribution data for the first substrate while changing the standard configuration values of inspection parameters, and generate standard reflectance distribution data by accumulating the reflectance distribution data according to reference configuration values of the inspection parameters. The processor 50 may store the generated standard reflectance distribution data in a memory (not shown).

Thereafter, configuration values for each inspection parameter are defined considering various inspection conditions. Inspection parameters may be entered by a user. In addition, inspection parameters may be defined through sensor detection of the physical data of each optical instrument. For example, when the user arbitrarily sets an optical instrument, a sensor provided in the optical instrument may measure the corresponding physical quantity and provide the measured physical quantity to the processor 50. That is, the processor 50 may determine user input values or sensor detection values for inspection parameters as configuration values.

Thereafter, inspection is performed on the second substrate, which is the actual inspection target. The incident light R1 emitted from the light source 10 is incident on the second substrate through the illumination optical system 20, and the reflected light R2 reflected from the second substrate is transmitted through the imaging optical system 30 to the light detector 40, and then the processor 50 may acquire reflectance data for each pixel of the light detector 40. That is, the processor 50 may acquire measured reflectance distribution data using inspection parameters to which configuration values are applied. Here, the second substrate may be another reference substrate having the same characteristics with the first substrate. The second substrate may be a patterned wafer or non-patterned wafer of which reflectance is more sensitive to AOI than a typical wafer.

The processor 50 may calculate the AOI distribution within the FOV by comparing standard reflectance distribution data and measured reflectance distribution data. The processor 50 compares the measured reflectance distribution data for the second substrate with standard reflectance distribution data having the same parameter settings as the parameter settings used for inspection of the second substrate. That is, the processor 50 compares the reflectance of individual pixels with respect to the same parameter setting value. By comparing the reflectance of pixels to each other, whether AOI distortion is occurring (non-uniform AOI) may be detected. The processor 50 may determine whether there is a pixel with a reflectance difference greater than the reference value and detect a pixel having a reflectance outside the reference value. The processor 50 may detect the area of the pixel where AOI distortion occurs as the distortion area. Furthermore, the processor 50 may correct AOI distortion in the distortion area by means of software. In addition, the processor 50 may output an alarm about AOI distortion to enable the user to recognize the AOI distortion and take action.

According to the present disclosure, the processor 50 acquires reference reflectance distribution data for a third substrate using inspection parameters to which configuration values applied, compares the reference reflectance distribution data and the measured reflectance distribution data to extract a reference AOI value from the distortion area, corrects the AOI distortion in the distortion area using the reference AOI value, and outputs a spectral image with the AOI distortion corrected.

In the current apparatus state where AOI distortion occurs, per-pixel reference reflectance data is acquired to correct AOI distortion. The third substrate is a separate substrate used to secure reference reflectance data. The third substrate may correspond to a non-patterned wafer (NPW). Reference reflectance distribution data is obtained using the third substrate without a pattern, and a reference AOI value for AOI distortion correction is extracted through comparison of the reference reflectance data and measured reflectance distribution data. Using the reference AOI value extracted in this way, the processor 50 may correct the AOI value of the area where AOI distortion occurred and generate a spectral image with the corrected AOI value. In addition, the processor 50 may investigate the surface characteristics of the substrate W through analysis of the corrected spectral image.

Furthermore, the optical-based substrate inspecting apparatus 1 according to the present disclosure may output an alarm to the user so that the user can recognize information on the occurrence of AOI distortion. That is, the processor 50 may output an alarm regarding the occurrence of AOI distortion. The processor 50 may output an alarm through a display (not shown) provided in the optical-based substrate inspecting apparatus 1 or through a communication device.

The processor 50 may output an alarm when AOI distortion occurs more than the standard number of times. The processor 50 may perform inspection through correction without alarming for AOI distortion that occurs sporadically, but may output an alarm to the user for similar AOI distortion that occurs repeatedly. Since AOI distortion in a specific area that occurs repeatedly may be a hardware problem, the processor 50 may induce the user to take action by outputting an alarm.

In addition, the processor 50 may output an alarm when the degree of AOI distortion is greater than the allowable range. In case of slight AOI distortion within the allowable range, inspection may be performed through software correction, but in the case of large AOI distortion outside the allowable range, it may be a hardware problem, and thus the processor 50 may induce the user to take action by outputting an alarm. The user may check the alarm and check information about AOI distortion to see if there is anything wrong with the optical system, if there is a problem with the stage supporting the substrate W, or if there are software errors in processing data.

Figure 4:
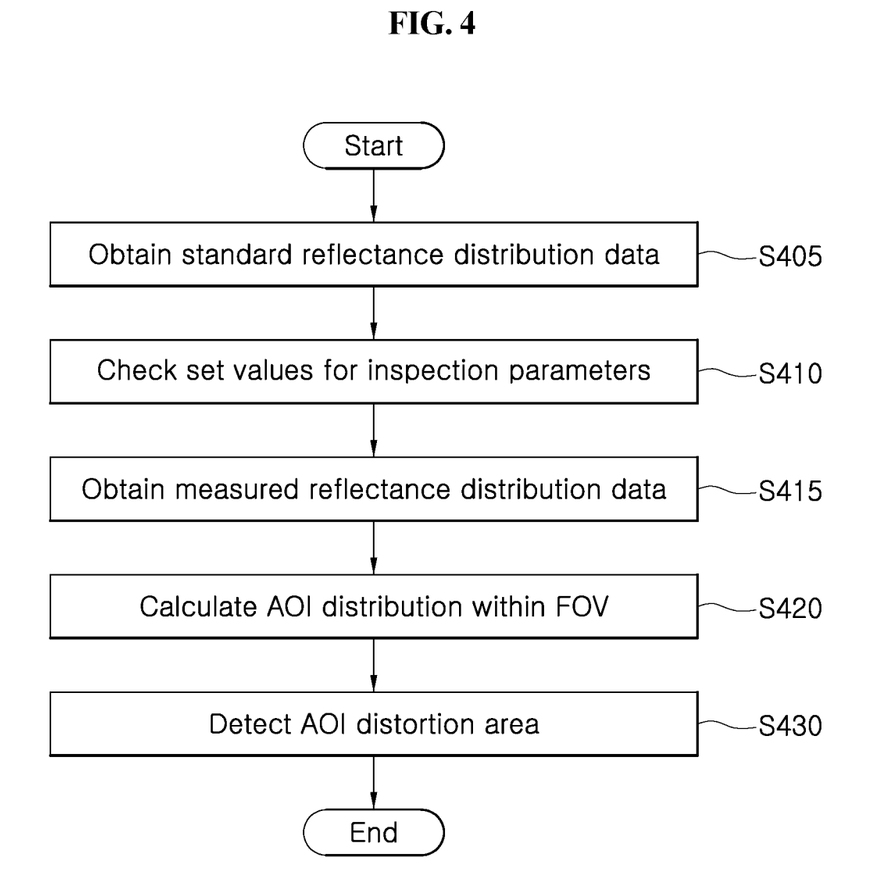
FIG. 4 is a flowchart showing an operating method of the optical-based inspecting apparatus according to the present disclosure.

FIG. 4 is a flowchart showing an operating method of the optical-based substrate inspecting apparatus 1 according to the present disclosure. The operating method of the optical-based substrate inspecting apparatus 1 according to the present disclosure includes: obtaining standard reflectance distribution data according to changes in inspection parameters for the first substrate (S405); identifying configuration values for the inspection parameters (S410); obtaining measured reflectance distribution data for the second substrate using the inspection parameters to which the configuration values are applied (S415); calculating the AOI distribution within the FOV by comparing the standard reflectance distribution data and the measured reflectance distribution data (S420); and detecting the distortion area where AOI distortion occurs in the FOV based on the AOI distribution (S430).

According to the present disclosure, inspection parameters may include the passing frequency of the incident light R1, the polarization component of the incident light R1, and the polarization component of the reflected light R2.

Figure 5:
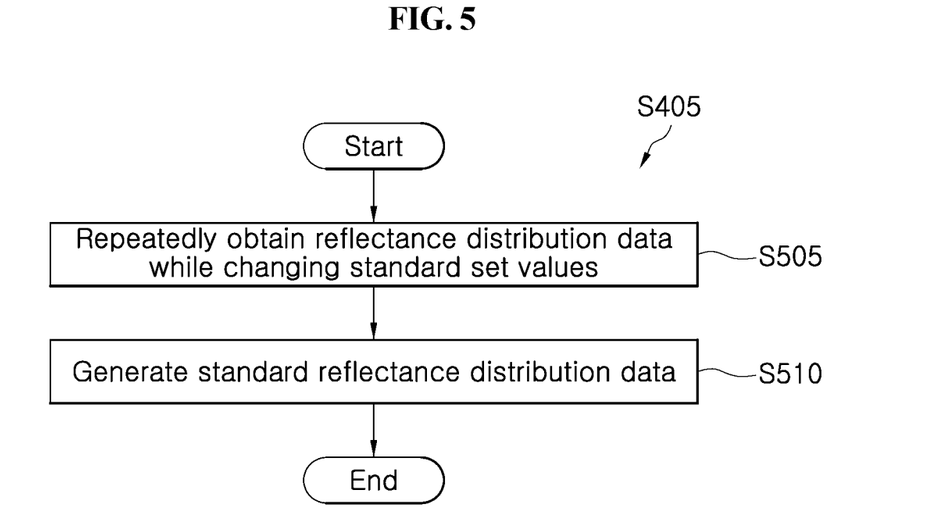
FIG. 5 is a flowchart showing a process of obtaining standard data according to the present disclosure.

FIG. 5 is a flowchart showing a process of obtaining standard data according to the present disclosure. The step of obtaining standard reflectance distribution data (S405) includes: repeatedly obtaining reflectance distribution data for the first substrate while changing the standard configuration values of inspection parameters (S505), and generating standard reflectance distribution data by accumulating reflectance distribution data according to the standard configuration values of inspection parameters (S510).

According to the present disclosure, the step of identifying configuration values for the inspection parameters (S410) includes: determining user input values or sensor detection values for inspection parameters as configuration values.

Figure 6:
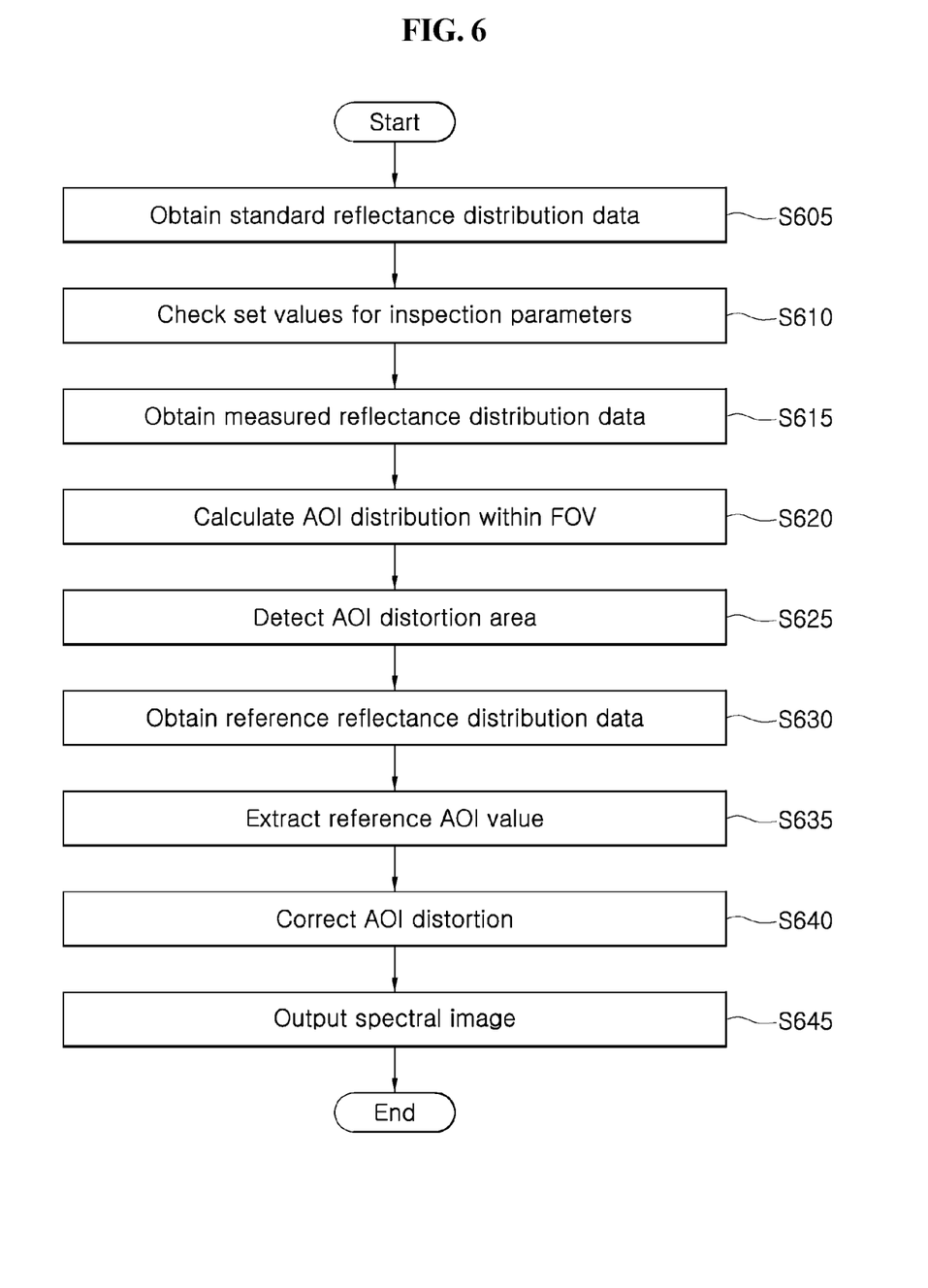
FIG. 6 is a flowchart showing an example of the operating method of the optical-based substrate inspecting apparatus including an AOI distortion correction step.

Meanwhile, the operating method of the optical-based substrate inspecting apparatus 1 may further include: detecting and correcting AOI distortion and outputting a spectral image with the AOI distortion corrected. Referring to FIG. 6, the operating method of the optical-based substrate inspecting apparatus 1 includes: obtaining standard reflectance distribution data according to changes in inspection parameters for the first substrate (S605); identifying configuration values for the inspection parameters (S610); obtaining measured reflectance distribution data for the second substrate using the inspection parameters to which the configuration values are applied (S615); calculating the AOI distribution within the FOV by comparing the standard reflectance distribution data and the measured reflectance distribution data (S620); detecting the distortion area where AOI distortion occurs in the FOV based on the AOI distribution (S625); obtaining reference reflectance distribution data for the third substrate using inspection parameters to which configuration values applied (S630); comparing the reference reflectance distribution data and the measured reflectance distribution data to extract a reference AOI value from the distortion area (S635); correcting the AOI distortion in the distortion area using the reference AOI value (S640); and outputting a spectral image with the AOI distortion corrected (S645).

Figure 7:
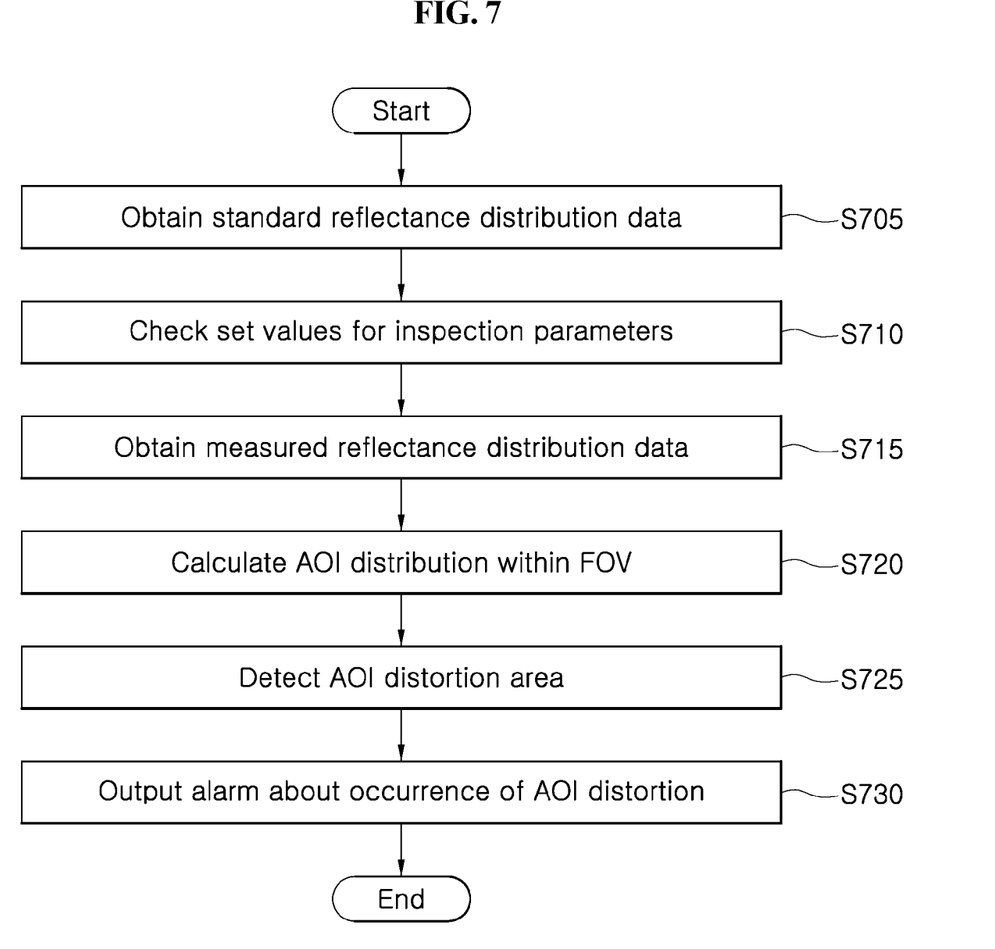
FIG. 7 is a flowchart showing an example of the operating method of the optical-based substrate inspecting apparatus including an alarm output step for AOI distortion.

In addition, when AOI distortion occurs, a process of prompting the user to take action by outputting an alarm to the user may be performed. Referring to FIG. 7, the operating method of the optical-based substrate inspecting apparatus 1 includes: obtaining standard reflectance distribution data according to changes in inspection parameters for the first substrate (S705); identifying configuration values for the inspection parameters (S710); obtaining measured reflectance distribution data for the second substrate using the inspection parameters to which the configuration values are applied (S715); calculating the AOI distribution within the FOV by comparing the standard reflectance distribution data and the measured reflectance distribution data (S720); detecting the distortion area where AOI distortion occurs in the FOV based on the AOI distribution (S725); and outputting an alarm about the occurrence of AOI distortion (S730).

The step of outputting an alarm about the occurrence of AOI distortion (S730) may include: outputting an alarm when AOI distortion occurs more than the standard number of times or when the degree of AOI distortion is greater than the allowable range.

Figure 8:
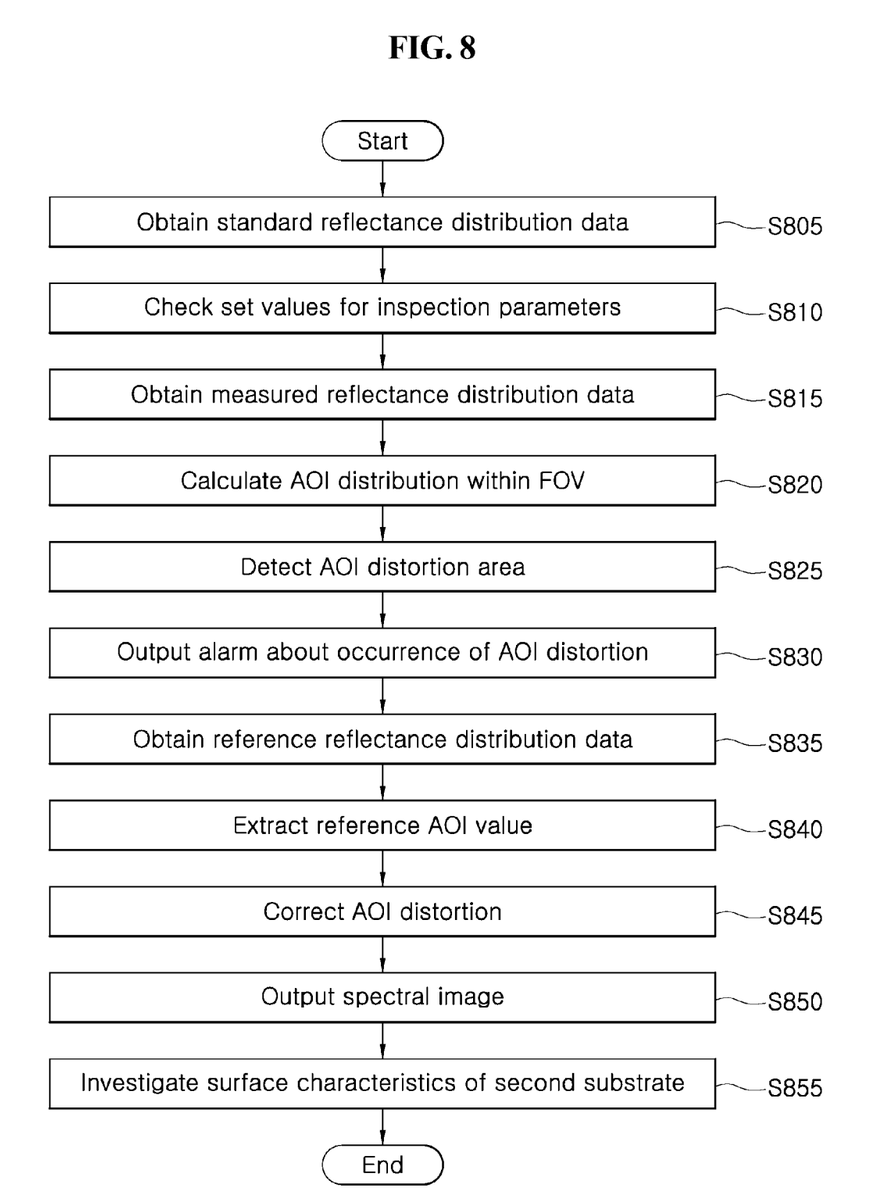
FIG. 8 is a flowchart showing another example of the optical-based substrate inspection method according to the present disclosure.

Meanwhile, inspection of the substrate may be performed through alarm output for AOI distortion and correction of AOI distortion. Referring to FIG. 8, the operating method of the optical-based substrate inspecting apparatus 1 includes: obtaining standard reflectance distribution data according to changes in inspection parameters for the first substrate (S805); identifying configuration values for the inspection parameters (S810); obtaining measured reflectance distribution data for the second substrate using the inspection parameters to which the configuration values are applied (S815); calculating the AOI distribution within the FOV by comparing the standard reflectance distribution data and the measured reflectance distribution data (S820); detecting the distortion area where AOI distortion occurs in the FOV based on the AOI distribution (S825); outputting an alarm about the occurrence of AOI distortion (S830); obtaining reference reflectance distribution data for the third substrate using inspection parameters to which configuration values applied (S835); comparing the reference reflectance distribution data and the measured reflectance distribution data to extract a reference AOI value from the distortion area (S840); correcting the AOI distortion in the distortion area using the reference AOI value (S845); outputting a spectral image with the AOI distortion corrected (S850); and investigating the surface characteristics of the second substrate from the spectral image (S855).

The present embodiments and the drawings accompanying this specification only clearly show some of the technical ideas included in the present disclosure, and it will be apparent that all modifications and specific embodiments that may be easily inferred by those skilled in the art within the scope of the technical idea included in the specification and drawings of the present disclosure are included in the scope of the present disclosure.

Therefore, the spirit of the present disclosure should not be limited to the described embodiments, and it will be said that not only the claims to be described later but also all things that are equivalent to the claims or have equivalent modifications belong to the scope of the present disclosure.

What is claimed is:

1. An optical-based substrate inspecting apparatus, comprising:
   a light source configured to generate incident light;
   an illumination optical system configured to form an optical path of the incident light;
   an imaging optical system configured to form an optical path of reflected light reflected from a substrate;
   a light detector configured to receive the reflected light and convert the received reflected light into an electrical signal; and a processor configured to generate a spectral image from the electrical signal, wherein the processor is configured to:

obtain standard reflectance distribution data according to changes in inspection parameters for a first substrate which is a reference substrate;

identify configuration values for the inspection parameters;

obtain measured reflectance distribution data for a second substrate which is another reference substrate, using the inspection parameters to which the configuration values are applied;

calculate an angle of incidence (AOI) distribution within a field of view (FOV) by comparing the standard reflectance distribution data and the measured reflectance distribution data; and detect a distortion area where AOI distortion occurs in the FOV based on the AOI distribution.

2. The substrate inspecting apparatus of claim 1, wherein the illumination optical system comprises:

a frequency filter configured to pass a frequency component corresponding to a passing frequency in the incident light; and a polarization filter configured to pass a specific polarization component in the incident light.

3. The substrate inspecting apparatus of claim 1, wherein the imaging optical system comprises:

an analyzer configured to pass a specific polarization component in the reflected light.

4. The substrate inspecting apparatus of claim 2, wherein the frequency filter corresponds to a bandpass filter.

5. The substrate inspecting apparatus of claim 2, wherein the frequency filter corresponds to a Bragg notch filter consisting of a plurality of polarized mirrors.

6. The substrate inspecting apparatus of claim 1, wherein the inspection parameters include a passing frequency of the incident light, a polarization component of the incident light, a polarization component of the reflected light, an AOI of the incident light.

7. The substrate inspecting apparatus of claim 1, wherein the processor is configured to:

repeatedly obtain reflectance distribution data for the first substrate while changing standard configuration values of the inspection parameters; and generate standard reflectance distribution data by accumulating the reflectance distribution data according to reference configuration values of the inspection parameters.

8. The substrate inspecting apparatus of claim 1, wherein the processor is configured to determine user input values or sensor detection values for the inspection parameters as the configuration values.

9. The substrate inspecting apparatus of claim 1, wherein the processor is configured to:

obtain reference reflectance distribution data for a third substrate which is a non-patterned wafer, using the inspection parameters to which the configuration values applied;

compare the reference reflectance distribution data and the measured reflectance distribution data to extract a reference AOI value from the distortion area;

correct the AOI distortion in the distortion area using the reference AOI value; and output a spectral image with the AOI distortion corrected.

10. The substrate inspecting apparatus of claim 1, wherein the processor is configured to output an alarm about an occurrence of AOI distortion.

11. The substrate inspecting apparatus of claim 10, wherein the processor is configured to output the alarm when the AOI distortion occurs more than a standard number of times.

12. The substrate inspecting apparatus of claim 10, wherein the processor is configured to output the alarm when a degree of the AOI distortion is greater than an allowable range.

13. An operating method of an optical-based substrate inspecting apparatus, the operating method comprising:

obtaining standard reflectance distribution data according to changes in inspection parameters for a first substrate;

identifying configuration values for the inspection parameters;

obtaining measured reflectance distribution data for a second substrate using the inspection parameters to which the configuration values are applied;

calculating an angle of incidence (AOI) distribution within a field of view (FOV) by comparing the standard reflectance distribution data and the measured reflectance distribution data; and detecting a distortion area where AOI distortion occurs in the FOV based on the AOI distribution.

14. The operating method of claim 13, wherein the inspection parameters include a passing frequency of incident light, a polarization component of the incident light, and a polarization component of reflected light.

15. The operating method of claim 13, wherein the obtaining standard reflectance distribution data comprises:

repeatedly obtaining reflectance distribution data for the first substrate while changing standard configuration values of the inspection parameters; and generating standard reflectance distribution data by accumulating the reflectance distribution data according to reference configuration values of the inspection parameters.

16. The operating method of claim 13, wherein the identifying configuration values for the inspection parameters comprises:

determining user input values or sensor detection values for the inspection parameters as the configuration values.

17. The operating method of claim 13, further comprising:

obtaining reference reflectance distribution data for a third substrate using the inspection parameters to which the configuration values applied;

comparing the reference reflectance distribution data and the measured reflectance distribution data to extract a reference AOI value from the distortion area;

correcting the AOI distortion in the distortion area using the reference AOI value; and outputting a spectral image with the AOI distortion corrected.

18. The operating method of claim 13, further comprising:

outputting an alarm about an occurrence of the AOI distortion.

19. The operating method of claim 18, wherein the outputting of the alarm about the occurrence of the AOI distortion comprises:

outputting the alarm when the AOI distortion occurs more than a standard number of times or a degree of the AOI distortion is greater than an allowable range.

20. An operating method of an optical-based substrate inspecting apparatus, the operating method comprising:

obtaining standard reflectance distribution data according to changes in inspection parameters for a first substrate;

identifying configuration values for the inspection parameters;

obtaining measured reflectance distribution data for a second substrate using the inspection parameters to which the configuration values are applied;

calculating an angle of incidence (AOI) distribution within a field of view (FOV) by comparing the standard reflectance distribution data and the measured reflectance distribution data;

detecting a distortion area where AOI distortion occurs in the FOV based on the AOI distribution;

outputting an alarm about an occurrence of the AOI distortion;

obtaining reference reflectance distribution data for a third substrate using the inspection parameters to which the configuration values applied;

comparing the reference reflectance distribution data and the measured reflectance distribution data to extract a reference AOI value from the distortion area;

correcting the AOI distortion in the distortion area using the reference AOI value;

outputting a spectral image with the AOI distortion corrected; and investigating surface characteristics of the second substrate from the spectral image.

* * * * *